March 18, 1969 | I. A. LESK | 3,434,023

SEMICONDUCTOR SWITCHING DEVICES WITH A TUNNEL JUNCTION DIODE IN SERIES WITH THE GATE ELECTRODE

Original Filed June 12, 1961

INVENTOR:
ISRAEL A. LESK

BY [signature]

HIS ATTORNEY.

United States Patent Office 3,434,023

Patented Mar. 18, 1969

3,434,023

SEMICONDUCTOR SWITCHING DEVICES WITH A TUNNEL JUNCTION DIODE IN SERIES WITH THE GATE ELECTRODE

Israel Arnold Lesk, Scottsdale, Ariz., assignor to General Electric Company, a corporation of New York Continuation of applications Ser. No. 116,478, June 12, 1961, and Ser. No. 516,297, Dec. 27, 1965. This application Dec. 28, 1967, Ser. No. 694,351

U.S. Cl. 317—235 4 Claims

Int. Cl. H01l *11/10, 19/00*

ABSTRACT OF THE DISCLOSURE

Gate firing characteristics of a PNPN gate fired switch are stabilized by making a portion of the emitter junction between one of the main electrodes and the gate electrode a tunnel junction diode in order effectively to place the tunnel diode in series with the gate electrode. In one embodiment, the gate electrode is connected directly to a degenerate region which forms the tunnel junction.

This application is a continuation of application, Ser. No. 516,297 filed Dec. 27, 1965 which in turn is a continuation of application, Ser. No. 116,478 filed June 12, 1961, and assigned to the assignee of the present invention, both abandoned.

The present invention relates, in general, to semiconductor devices and, in particular, to improvements in semiconductor devices of the multi-layer type having switch-like characteristics.

Such devices are described in an article by Moll, Tanenbaum, Goldey and Holonyak in Proceedings of the I.R.E., September 1956, volume 44, pp. 1174–1182. One version of such prior devices comprises a body of semiconductor material having four distinct layers with adjacent layers being of opposite conductivity type to form a plurality of P-N junctions and having an electrical terminal on each of the outside layers. When one terminal is biased in one polarity with respect to the other terminal, the two P-N junctions nearest the terminals become reversely biased and the center P-N junction becomes forwardly biased; thus a high impedance is presented between the terminals. If a sufficiently large potential is applied between the terminals, the two P-N junctions nearest the terminals break down and conduct current in the reverse direction. When the one terminal is biased in the other polarity with respect to the other terminal, the two P-N junctions nearest the terminals become forwardly biased, and the center P-N junction becomes reversely biased; thus a high impedance is again presented between the terminals. However, if the potential applied between the terminals is increased, eventually not only does the center P-N junction break down, but reverses in polarization and a very low impedance is presented between the terminals. As set forth in the I.R.E. article mentioned above, two requirements which must be fulfilled in order to obtain the reversal in polarity of the center P-N junction, and hence conduction thereacross, are (1) that at least one of the two transistor sections into which the device is resolvable, an NPN and a PNP transistor section with the center junction being the collector junction of both transistor sections, have a current gain, alpha, which increases with current, and (2) that the sum of the current gains of the two transistor sections be equal or greater than unity at some intermediate current. Sufficient current is passed by the center junction as a result of leakage or avalanche effects to enable the latter requirement to be met.

Devices such as described above are susceptible to spurious activation into a state of conductivity in response to temperature changes. In addition, in normal operation the voltages and currents at which it switches from its high to its low impedance state and also at which it switches from its low to its high impedance state may vary with environment conditions such as temperature.

In a copending application, Ser. No. 838,504, filed Sept. 8, 1959, Aldrich and Holonyak, and assigned to the assignee of the present invention, is disclosed and claimed an invention directed to overcoming such limitations. The present invention is directed to providing further improvements to such end as well as to providing modifications in structure and organization to enable such limitations to be more effectively overcome and at the same time permit new modes of operation.

Accordingly, it is an object of the present invention to provide novel semiconductor devices of improved characteristics.

It is another object of the present invention to provide devices of switch-type characteristics which are stable and relatively insensitive to temperature effects.

It is still another object of the present invention to provide simple yet precise means for achieving in novel four-layer devices such characteristics as turn-on and turn-off current.

In carrying out the present invention in one illustrative form thereof, there is provided a body of semiconductor material including four layers of one and the opposite conductivity type, layers of one conductivity type being interleaved with layers of the opposite conductivity type forming a plurality of P-N junctions therein. A heavily doped zone of the one or the opposite conductivity type is provided at the junction of one of the external layers and an adjacent intermediate layer to form a localized tunnel junction with either of said layers. Two electrodes are also provided, one electrode making low resistance ohmic contact with the surface of an external layer of said body, and the other electrode in low resistance ohmic contact with a surface of the other external layer of said body.

In one embodiment, an additional control electrode is provided making ohmic contact to the aforementioned intermediate layer. In another embodiment, an additional control electrode is provided, making ohmic contact to the aforementioned zone.

Further objects and advantages of the present invention will be more clearly understood by reference to the following description taken in connection with the accompanying drawings and its scope will be apparent in the appended claims.

Figure 1:
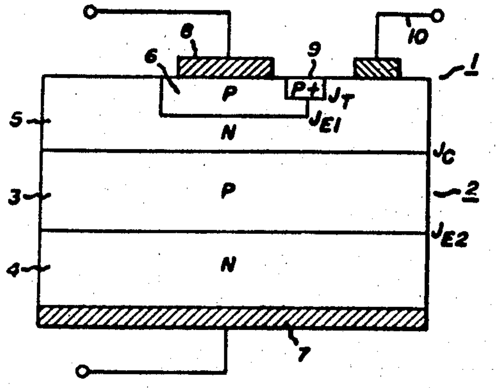
FIGURE 1 shows a sectional view of a four-layer three-electrode switching device in accordance with the present invention.

Referring now in particular to FIGURE 1, there is shown a cross-section view of an illustrative embodiment of the present invention. FIGURE 1 shows a semiconductor device 1 comprising a body of semiconductor material 2 having four layers or regions therein, a P-type conductivity intermediate region 3, an N-type conductivity external region 4 adjacent thereto, another N-type conductivity intermediate region 5 adjacent thereto, and a P-type conductivity erternal region 6 adjacent the N-type intermediate region 5. The N-type region 5 surrounds the P-type region 6 and has a surface in common with it. These regions meet to form three generally parallel P-N junctions $J_C$, $J_{E1}$ and $J_{E2}$. $J_C$ is referred to as the collector or center junction and is formed between the P-type region 3 and the N-type region 5. $J_{E1}$ is referred to as the first emitter junction, and is formed between N-type layer 5 and P-type layer 6. $J_{E2}$ is referred to as the second emitter junction and is formed between P-type layer 3 and N-type layer 4. A zone 9 of heavily P-type semiconductor is provided astride the junction $J_{E1}$ to form a tunnel junction $J_T$ with N-type conductivity region 5. The surface adjacent region of N-type conductivity region 5 is so impregnated with impurities as to produce this result.

A tunnel junction exists between two juxtaposed regions of opposite conductivity type in a body of semiconductor material when the regions are so heavily impregnated with activators or conductivity type determining impurities as to render at least one of the regions degenerate and the other approximately so, and the transition in impregnation sufficiently abrupt to provide a narrow space charge region adjacent the junction.

Degenerate, as applied to semiconductor material, designates material in which the Fermi-level lies either in the conduction or valence band on the energy band diagram of such material, depending on whether the material is N-type or P-type in conductivity. The concentration of donor or acceptor impurity necessary to render a semiconductive material degenerate depends on the particular semiconductive material. For example, the impurity concentration required to render germanium degenerate at room temperature is about $1X-10^{19}$ atoms per cubic centimeter, depending to some degree upon the particular impurity material utilized.

Narrow, as applied to the width of the space charge region, designates an order of magnitude sufficiently small such that at low voltages current flow thereafter is determined essentially by the quantum mechanical tunneling of electrons. The width of the P-N junction space charge region separating two regions of different conductivity type semiconductive material depends upon various factors as, for example, the particular semiconductive material and the concentration of donor and acceptor impurity in the respective regions thereof. For example, the P-N junction space charge region formed between a region of degenerate P-type and a region of degenerate N-type conductivity germanium is usually less than about 200 angstrom units wide.

When one or both regions of tunnel junction devices are only approximately degenerate, the device may exhibit only a week negative resistance region or none at all. Further details on tunnel junctions per se may be had by reference to any of a number of publications on this subject, for example, volume ED–7, number 1, January 1960, of the I.R.E. Transactions of the Professional Group on Electron Devices, R. N. Hall Tunnel Diodes or an article entitled "Germanium and Silicon Tunnel Diodes—Design, Operation and Application" by Lesk, Holonyak. Davidsohn and Aarons, appearing in the 1959 I.R.E. Wescon Convention Record, part 3, ECG–441.

An electrode 7 is secured in good conductive contact to the external surface of region 4 and another electrode 8 is secured in good conductive contact to region 6. An additional electrode 10 providing a control function is secured in good conductive contact to region 5.

Figure 2:
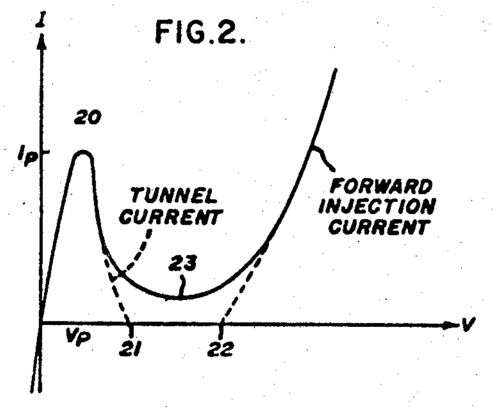
FIGURE 2 shows a graph of the current versus voltage characteristic of a tunnel junction useful in explaining the operation of the device of FIGURE 1.

Referring now to FIGURE 2, there is shown the current versus voltage characteristics of a tunnel junction structure such as formed by regions 5 and 9 of FIGURE 1. Applying either a forward or a reverse voltage across the junction will cause the quantum mechanical tunneling current so designated on the graph to increase rapidly with increasing small applied voltages. In the forward direction, tunneling current reaches a maximum at 20 and thereafter falls to point 21. With still greater voltage, normal injection current becomes noticeable at point 22 and increases until it predominates at higher voltages. The composite of the two currents is the current shown in the solid line in this figure.

The manner in which the tunnel junction and its characteristics are utilized in the device of FIGURE 1 will be explained in connection with FIGURE 3. This figure shows a graph of the voltage versus current characteristic of the device of FIGURE 1. In the graph the current flow between electrodes 7 and 8 is represented as the ordinate, and the voltage applied across the leads is represented as the abscissa. Assume that an increasing voltage is applied so as to render region 6 increasingly negative with respect to region 5. Junctions $J_{E1}$ and $J_{E2}$ become reversely biased, and as $J_T$ is a tunnel junction, only $J_{E2}$ blocks current flow across the device. The collector junction $J_C$ is forwardly biased. Thus a high impedance is presented across electrodes 7 and 8 until avalanche breakdown voltage of emitter junction $J_{E2}$ is reached, corresponding to voltage represented by abscissa 14 on the graph of FIGURE 3.

Assume that an increasing voltage is applied between leads 7 and 8 to render region 6 increasingly positive with respect to region 5. With such voltage applied, junctions $J_{E1}$ and $J_{E2}$ become forward biased and junction $J_C$ becomes reversely biased. At low currents $J_{E1}$ is inoperative as an emitter as all of the current flowing thereacross is tunneling current. As the voltage across the device increases, only a small saturation current flows representing reverse current across junction $J_C$, shown as ordinate 15 on the graph of FIGURE 3 until the avalanche breakdown voltage $V_{BO}$ of junction $J_C$ is reached. At this voltage the junction $J_C$ breaks down and the current increases. When the current reaches point 16, corresponding to the peak current of the tunnel junction, the voltage across $J_{E1}$ between region 9 and region 5 jumps to a value in the injecting region, thereby permitting region 6 to function as a normal emitter. At this current, $I_s$, referred to as the turn-on current, at which the low voltage alpha sum of the NPN and PNP transistor sections of the device is greater than unity, the device switches to its low impedance state and to a voltage corresponding to abscissa 17 on the graph of FIGURE 3.

Figure 3:
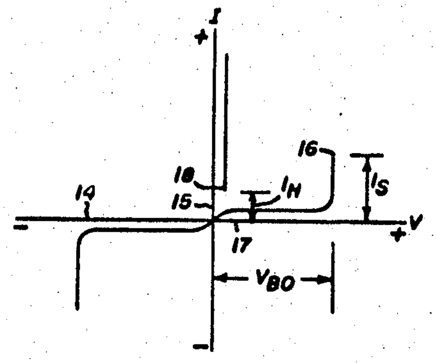
FIGURE 3 is a graph of the current versus voltage characteristic of the device of FIGURE 1.

When external circuit requirements are such that the current is less than the minimum value necessary to maintain the device in conduction as represented by $I_H$ in FIGURE 3 and by ordinate 18, the device ceases to conduct and reverts to its non-conductive state. This state occurs near or at the valley point 23 of the graph of FIGURE 2.

As the tunnel junction peak current is virtually independent of temperature, the switch-on current of the device can be made independent of temperature. Also, the turn-on current can be precisely set by setting the tunnel junction peak current and arranging this current to be greater than the switching-on current for a normal four-layer device without zone 9. In addition, the hold current can be set by setting the valley current of the tunnel junction by, for example, appropriate impregnation of the regions forming the tunnel junction. With decreasing currents, the device will turn-off at currents very close to the valley current of the tunnel junction.

The device of FIGURE 1 can be made to switch on at various applied voltages between electrodes 7 and 8 by the application of control potentials between electrodes 8 and 10. When a voltage is applied across these electrodes to cause the forward current across the tunnel junction $J_T$ to exceed its peak current, the device acts as a normal four-layer PNPN device, as explained above.

The device shown in FIGURE 1 may be constructed by any of a variety of techniques. In one such technique, diffusion is used to form the various regions of the device. A wafer of silicon semiconductor material of P-type conductivity having a resistivity of 3 ohm centimeters with dimensions approximately 100 mils square and 15 mils thick (a mil is one-thousandth of an inch) is the starting material. Phosphorus from a suitable source such as phosphorus pentoxide is diffused into both sides of the wafer. Subjecting the wafer at 1200° centigrade for from four to twelve hours to an atmosphere of phosphorus pentoxide in a nitrogen carrier would be suitable for this purpose. The surface of the wafer is then oxidized at high temperatures by exposure to a stream of steam. The surface of the wafer in which the P-type region 6 is to be formed may be protected from oxidation or subsequent to oxidaiton is etched to remove the oxide layer from a localized spot. Boron from a boron trioxide source is then diffused into the unoxidized surface of the wafer. Subjecting the wafer at a temperature of about 1200° centigrade for from one to four hours to an atmosphere of boron trioxide in a nitrogen carrier would be suitable for this purpose. The surfaces of the wafer are then ground and etched, or just etched, to remove the oxide layers. P-type zone 9 is formed by alloying a P-type alloy such as aluminum with 2 percent boron into the wafer. A conductive coating of gold is evaporated on the body to form electrode 7, and a conductive coating of aluminum is evaporated on the body to form electrode 8. Conductive coatings of other metals, such as nickel and lead, for example, may be applied in place of those mentioned by any of a number of techniques well known in the art. A suitable conductive electrode 10 is then secured to region 5 by any one of the techniques mentioned above. The emitter-base tunnel characteristic may be controlled by etching as well as by the initial diffused impurity profile of the N-type region 5. Such an etch technique is disclosed in a copending application, Ser. No. 858,995, filed Dec. 11, 1959, J. J. Tiemann, assigned to the assignee of the present invention.

Figure 4:
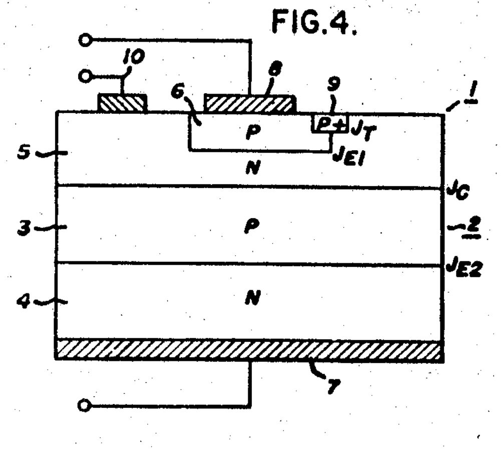
FIGURE 4 shows a sectional view of another embodiment of a four-layer three-electrode switching device in accordance with the present invention.

The device of FIGURE 4 is similar to the device of FIGURE 1 and corresponding elements have the same designations. The device of FIGURE 4 differs from the device of FIGURE 1, however, in that control electrode 10 is secured to a part of intermediate layer 5 remote from zone 9. With such an arrangement control current flow between electrodes 10 and 8 through tunnel junction $J_T$ passes in a path parallel to $J_{E1}$ and biases in the forward direction the part of junction $J_{E1}$ remote from the point shorted by junction $J_T$. If the sheet resistance of region 5 responsible for this bias is arranged such that the voltage drop along the junction $J_{E1}$ is slightly less than required to cause the remote edge of junction $J_{E1}$ to inject at the peak current of the tunnel junction, the device will switch to its low impedance state between electrodes 7 and 8 when the tunnel junction reaches its peak current. Of course, it is assumed for such injection the alpha versus current requirement referred to above is met.

Figure 5:
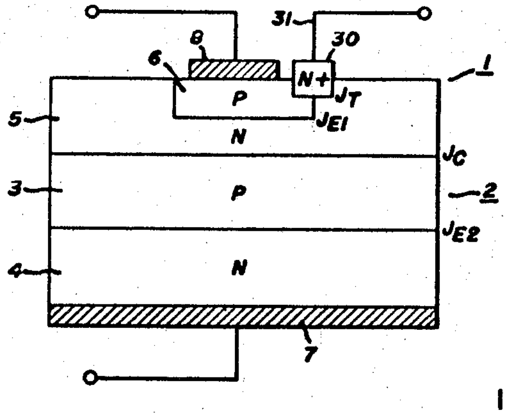
FIGURE 5 shows a sectional view of still another embodiment of a four-layer three-electrode switching device in accordance with the present invention.

The device of FIGURE 5 is similar to the device of FIGURE 1 and corresponding elements have the same designations. The device of FIGURE 5 differs from the device of FIGURE 4 in that the heavily impregnated zone 30 formed at the junction $J_{E1}$ is of the same conductivity type as the intermediate layer and forms with external layer 6 a tunnel junction and also in that ohmic contact is made to the zone by electrode 31. The tunnel junction shorts the emitter junction $J_{E1}$ at low currents as its impedance is low. In response to voltages applied between electrodes 8 and 31, the tunnel junction current can be increased to its peak current, at which time it switches to its high impedance state and permits current to flow directly from electrode 8 to electrode 7. Of course, it is assumed that sufficient voltage is applied between electrodes 7 and 8 to permit the switching to the low impedance state of the PNPN device in the absence of the zone 30.

While the invention has been shown and described in connection with particular embodiments of the invention, it will be apparent to those skilled in the art that changes and modifications may be made without departing from the invention in its broader aspects. It is, therefore, intended that the appended claims cover all such changes and modifications as fall within the true spirit and scope of the invention.

What is claimed:

1. A semi-conductor switching device comprising a semi-conductor body including a first region of one conductivity type, a second region of a second conductivity type, a third region of said one conductivity type and a fourth region of said second conductivity type, said third region surrounding a portion of said fourth region, a limited zone of degenerately doped material of said second conductivity type astride a portion of the junction formed by said third and fourth regions, said third region including a degenerately doped surface of said first conductivity type adjacent said limited zone, a first electrode in low ohmic contact with said first region, a second electrode in low ohmic contact with said third region and a third electrode in low ohmic contact with said fourth region, said second and third electrodes being remote from said limited zone.

2. A semi-conductor switching device comprising a semi-conductor body including a first region of one conductivity type, a second region of a second conductivity type, a third region of said one conductivity type and a fourth region of said second conductivity type, said third region surrounding a portion of said fourth region and forming a surface in common therewith, a limited zone of degenerately doped material of said second conductivity type astride a portion of the junction formed by said third and fourth regions, said third region including a degenerately doped surface of said first conductivity type adjacent said limited zone, a first electrode in low ohmic contact with said first region, a second electrode in low ohmic contact with said third region and a third electrode in low ohmic contact with said fourth region, said second and third electrodes being remote from said limited zone.

3. A semi-conductor switching device comprising a semi-conductor body including a first region of one conductivity type, a second region of a second conductivity type, a third region of said one onductivity type and a fourth region of said second conductivity type, said third region surrounding a portion of said fourth region and forming a surface in common therewith, a limited zone of degenerately doped material of said second conductivity type astride a portion of the junction formed by said third and fourth regions and forming a surface in common with said third and fourth regions, and third region including a degenerately doped surface of said first conductivity type adjacent said limited zone, a first electrode in low ohmic contact with said first region, a second electrode in low ohmic contact with said third region and a third electrode in low ohmic contact with said fourth region, said second and third electrodes being remote from said limited zone.

4. A semi-conductor switching device comprising a semi-conductor body including a first region of one conductivity type, a second region of a second conductivity type, a third region of said one conductivity type and a fourth region of said second conductivity type, said third region surrounding a portion of said fourth region to form a surface in common therewith and forming the emitter and base of said device, a limited zone of degenerately doped material of said second conductivity type astride a portion of the junction formed by said third and fourth regions and forming a surface in common with said third and fourth regions, said third region including a degenerately doped surface of said first conductivity type adjacent said limited zone, a first electrode in low ohmic contact with said first region, a second electrode in low ohmic contact with said third region and a third electrode in low ohmic contact with said fourth region, said second and third electrodes being remote from said limited zone.

References Cited

UNITED STATES PATENTS

| | | | |
|---|---|---|---|
| 3,034,106 | 5/1962 | Grinich | 340—173 |
| 3,079,512 | 2/1963 | Rutz | 307—88.5 |
| 3,176,147 | 3/1965 | Miller | 307—88.5 |

JOHN W. HUCKERT, *Primary Examiner.*

M. EDLOW, *Assistant Examiner.*

U.S. Cl. X.R.

317—234; 307—284